United States Patent
Miyashita et al.

(10) Patent No.: US 7,657,039 B2
(45) Date of Patent: Feb. 2, 2010

(54) SOUND QUALITY ENHANCEMENT CIRCUIT FOR AUDIO SIGNALS AND AUDIO AMPLIFIER CIRCUIT USING THE SAME

(75) Inventors: Takashige Miyashita, Kyoto (JP); Hiroyuki Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1029 days.

(21) Appl. No.: 10/960,087

(22) Filed: Oct. 8, 2004

(65) Prior Publication Data
US 2005/0084117 A1    Apr. 21, 2005

(30) Foreign Application Priority Data
Oct. 15, 2003    (JP)    ............... 2003-354647

(51) Int. Cl.
| | |
|---|---|
| H04R 1/40 | (2006.01) |
| H03G 5/00 | (2006.01) |
| H03G 3/00 | (2006.01) |
| H04B 3/14 | (2006.01) |
| H03G 5/02 | (2006.01) |

(52) U.S. Cl. .................. 381/97; 381/98; 381/99; 381/100; 381/103; 381/61; 333/28 R; 333/28 T (58) Field of Classification Search .......... 381/97–100, 381/103, 27, 61; 333/28 R, 28 T; 33/28 T, 33/28 R
See application file for complete search history.

(56) References Cited

U.S. PATENT DOCUMENTS 4,566,119 A * 1/1986 Peters ................... 381/103
4,748,669 A   5/1988 Klayman

FOREIGN PATENT DOCUMENTS

JP    2609065    5/1997

OTHER PUBLICATIONS

Applicant's admitted prior art, p. 4, line 1-p. 6, line 16.*

* cited by examiner

*Primary Examiner*—Devona E Faulk
(74) *Attorney, Agent, or Firm*—Mattingly & Malur, PC (57) ABSTRACT

The present invention comprises a circuit having at least not less than three cascade connected phase shift circuits and wherein the phase characteristic of the circuit is determined in such a manner that the phase of the audio input signals is gradually delayed depending on logarithmic increase of frequencies in a range of audible frequencies and a phase delay in a range of 450 degree~600 degree in total in the range of audible frequencies is caused.

8 Claims, 6 Drawing Sheets

SOUND QUALITY ENHANCEMENT CIRCUIT FOR AUDIO SIGNALS AND AUDIO AMPLIFIER CIRCUIT USING THE SAME

BACKGROUND OF THE INVENTION

1. Field of the Invention

The present invention relates to a sound quality enhancement circuit for audio signals and an audio amplifier circuit using the same and more specifically, relates to a sound quality enhancement circuit which enhances sound clarity, easily realizes an upper position of sound image for sound image positionality, is easily formed in an IC and is suitable for driving, in particular, a small full range corn type speaker.

2. Background Art

Different from an acoustic space where a full scale component stereo is disposed, an acoustic space where an audio apparatus including a car stereo and such as a TV apparatus (such as a TV receiver and a TV video game machine), a DVD, a mini component stereo and a computer audio is disposed is frequently either comparatively limited because such as a variety of apparatuses and furniture are disposed therein or comparatively narrow such as a room in a car. Moreover, since the speaker used is a small size, even in a case of a full range corn type dynamic speaker (herein below called as corn type speaker) or a two way speaker, the crossover frequency is high, for example, more than 5000 Hz, therefore a speaker system constituted primarily by a full range speaker combining a substantially a full range corn type speaker and a tweeter is frequently used.

Now, as important factors required for a speaker with regard to sound reproducibility, three characteristics, in that sound pressure frequency characteristic, amplitude characteristic and transient characteristic are enumerated. Among these, a speaker transient characteristic is recently drawn attention. In case of a corn type speaker, an offset of rise up vibration characteristic with respect to the speaker input signal is caused depending on frequencies. Such offset increases in a low frequency region (audio signal of frequencies less than 200 Hz) and gradually decreases toward a high frequency region (audio signal of frequencies more than 4.0 kHz) and the delay thereof also decreases.

The reason of the above is that although a corn type speaker produces a sound through vibration of the corn driven by a voice coil motor, since components in the low frequency region are produced through vibration of the entire corn and components in the high frequency region are radiated from a center portion of the corn (dome portion), the rise up speed of the high frequency components is high and the rise up speed of the low frequency components is delayed because of inertia difference of the vibrating corn. The offset increases depending on the size reduction of the small speaker.

On one hand, when a speaker is driven by applying a power output signal representing an audio signal to the speaker through such as equalizer and a filter and even if the power output signal shows a flat frequency characteristic, if there is a delay in the high frequency region with respect to the low frequency region, a delay is generally caused in the harmonic components of the audio signal and the clarity of the sound obtained from the speaker is deteriorated. In order to restore the deteriorated clarity, the high frequency region is generally boosted, however, the sound becomes hard which is problematic.

For this reason, with regard to a small size speaker, a predetermined phase characteristic is added by correcting the phase of the input signal, and further the sound clarity is enhanced by increasing the amplification degree in the high frequency region.

With regard to the above referred to acoustic apparatuses which are used in a comparatively narrow space, in order to enhance the sound image and clarity of the sound in view of transient characteristic of the speaker, a technology is also known which takes into account of head related transfer function (HRTF) representing acoustics transferred to a human, shifts a sound image produced from a lower position toward an upper position for sound image positionality and increases the sound clarity by making use of a sense of human with respect to sound in vertical direction.

Further, it is known that the frequency components relating to the sense in the upper position of sound image for sound image positionality are ones near 4 kHz and 8 kHz. The sound image varies upward by emphasizing the frequency components near to 4 kHz and 8 kHz. It is likely known that the frequency components that contribute clarity of human voice are near at 2.5 kHz.

BBE process technology that is one of sound quality enhancement technologies performs a correction process for audio signals for increasing the clarity thereof, in which the harmonic components delayed with respect to the fundamental wave are moved before the fundamental wave to approximate the sound wave form to natural sound and further the high frequency components are boosted. The sound quality enhancement thereby achieves a large effect with respect to the clarity through synergistic effect of phase correction and high frequency region boosting with a less boosting amount compared when an equalizer is used. Further, an example of BBE process technologies is disclosed in JPH10-75138A. Still further, the same type of sound quality enhancement circuit is disclosed in JP Patent No. 2,609,065.

In the BBE process technology as disclosed in JPH10-75138A, the audio signals are divided into high frequency region, intermediate frequency region and low frequency region, the signals are respectively processed by preamplifiers of three channels, after providing delays for the signals through filtering process and adjusting the phase of the audio signals, the signals processed through the respective channels are synthesized by mixing. Thereby, the clarity of the sound generated from the speaker is enhanced. This technology is utilized such as in recording studios and broadcasting stations.

Specifically, for the low frequency region, audio signals having frequencies less than 150 Hz are dealt, for the intermediate frequency region, audio signals having frequencies in a range of 150 Hz~1.2 kHz are dealt and for the high frequency region, audio signals having frequency more than 1.2 kHz are dealt. An example of gain and phase correction characteristic by the BBE process technology is shown in FIG. 5 (a) and (b).

Figure 5A:
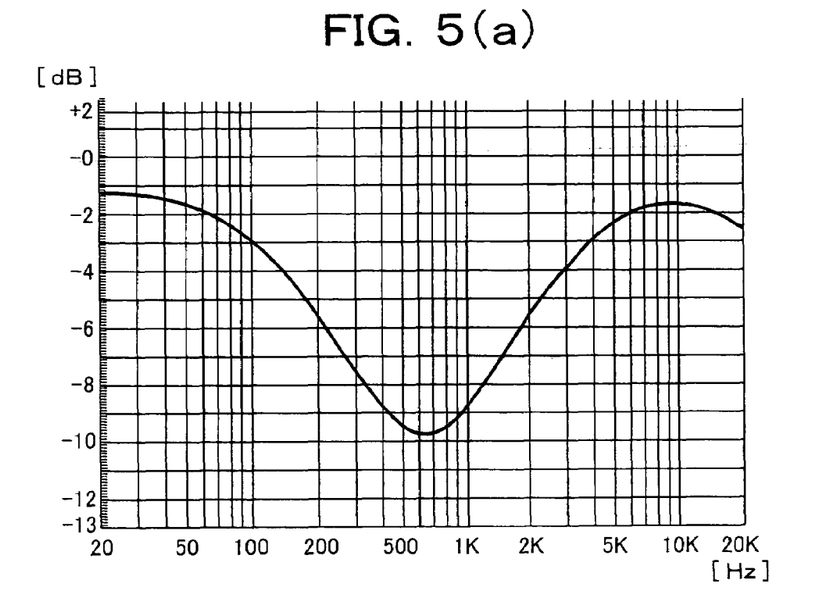
FIG. 5 is a view for explaining a gain characteristic and phase characteristic with respect to frequency in a sound quality enhancement circuit embodying BBE process technology.
Figure 5B:
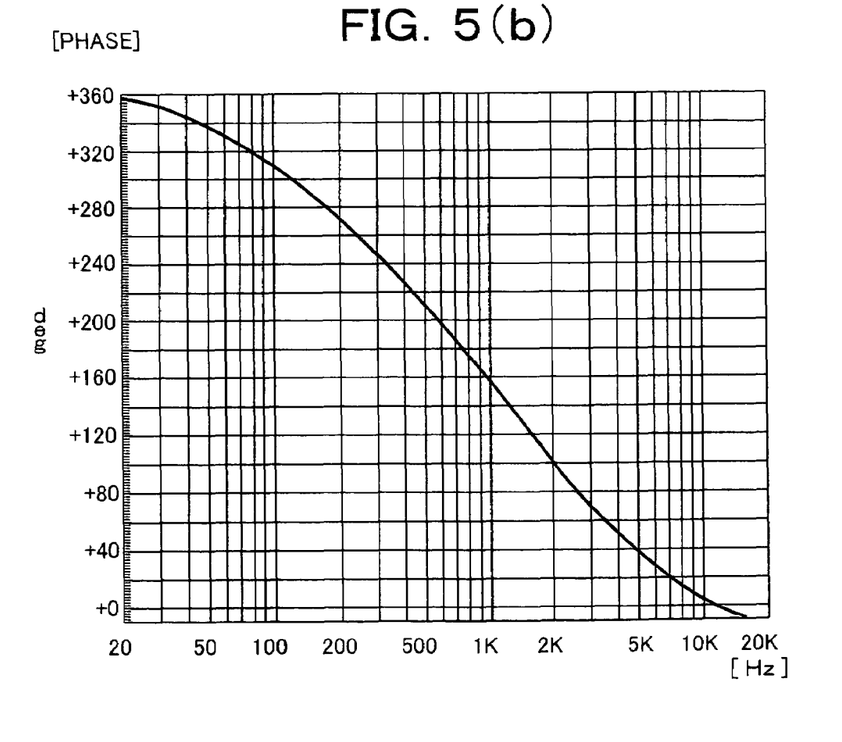

As seen from FIG. 5 (b) in which phase characteristic with respect to frequencies is shown, the phase is gradually delayed along a linear inclination depending on logarithmic increase of frequencies from the low frequency region to the intermediate frequency region and to high frequency region and resultantly, a characteristic delaying the phase by 360 degree over the range of audible frequencies (20 Hz~20 kHz) is provided.

In the gain characteristic as shown in FIG. 5 (a), a crest is provided near at 600 Hz and at the both sides thereof, for example, in a range of 600 Hz~3 kHz the amplitude is enhanced by about 10 dB/dec. Thereby, a characteristic which enhances the frequency components near and above 2.5 kHz is obtained.

However, in the above sound quality enhancement processing, since the frequency region has to be divided into three regions, when the signals in the three regions are synthesized, a slack is caused in the intermediate frequency region and a problem of sound drop off is generated.

Figure 6:
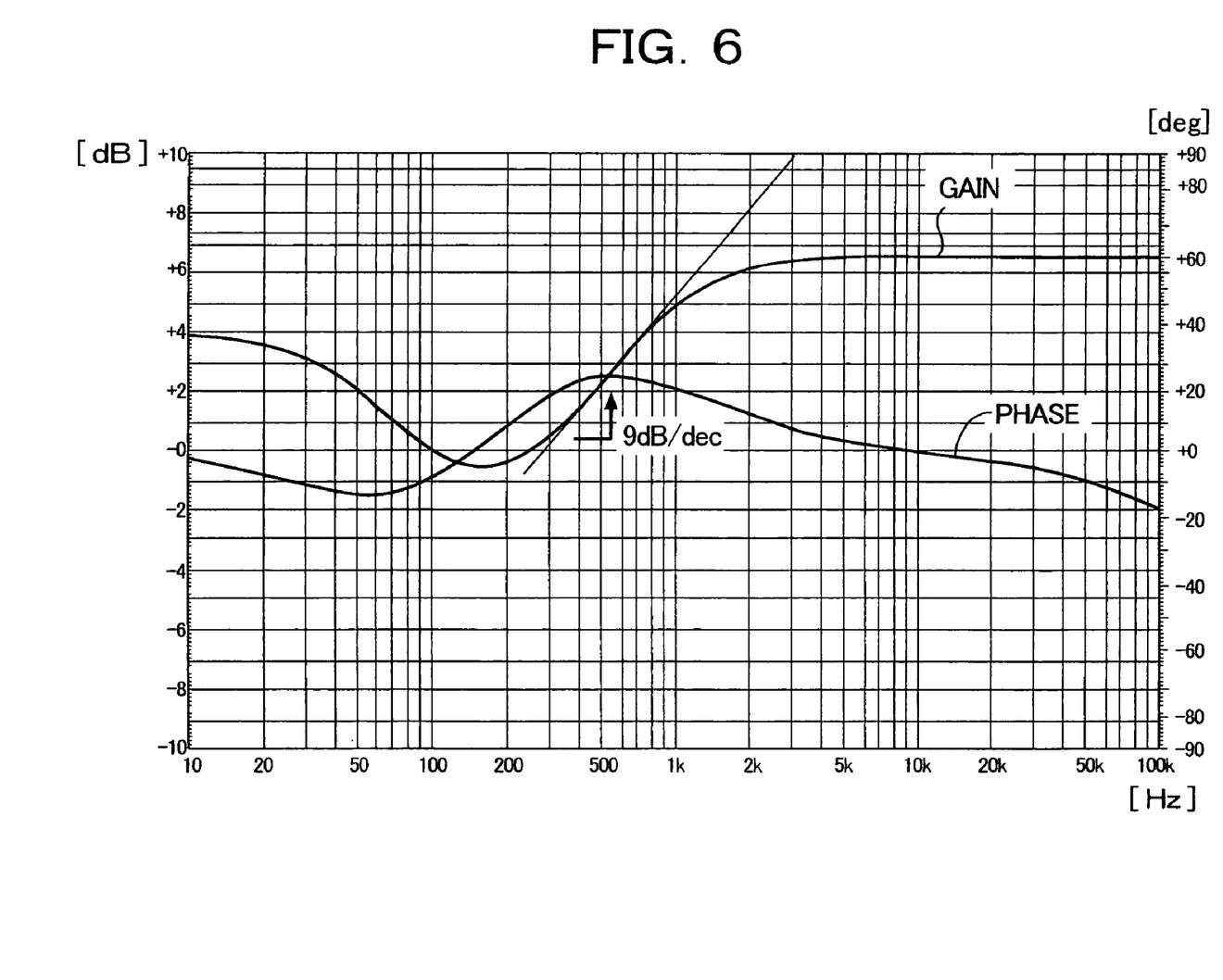
FIG. 6 is a view for explaining a gain characteristic and phase characteristic with respect to frequency in a sound quality enhancement circuit in which a position of sound image for sound image positionality is shifted toward an upper in vertical direction.

On the other hand, in the gain and phase correction characteristic by means of the technology in which a position of sound image for sound image positionality is shifted toward an upper in vertical direction by taking into account the head related transfer function, as seen from FIG. 6 in which phase and gain characteristic with respect to frequencies is shown, the phase variation in the phase characteristic is not so significant, a characteristic having a crest near at 500 Hz is provided. With regard to the gain characteristic, the boosting is started near at 300 Hz, the amplitude in the range of 300 Hz~1 kHz is enhanced by 9 dB/dec and the gain characteristic from the low frequency region to the intermediate region is improved. Thereby, the frequency components of 2.5 kHz and above are emphasized, clarity of sound is enhanced and the sound image is shifted upward.

On one hand, in a small full range corn type speaker or a system constituted substantially by a small full range speaker, since the diameter of the voice coil is shorten and the efficiency thereof is reduced, the sound clarity can not be increased, even if the BBE process technology is applied. Moreover, with regard to the gain characteristic, if the boosting is started near at 300 Hz, the amplitude in the range of 300 Hz~1 kHz is enhanced by 9 dB/dec and the gain characteristic is improved, the sound quality in voice region of 500 Hz~1 kHz varies and a problem of increasing noises arises.

In particular, in connection with cell phones using a small speaker having diameter of 1.5 cm~3 cm, it is difficult to expect sound quality enhancement with the above technology.

SUMMARY OF THE INVENTION

An object of the present invention is to solve the above problems in the conventional technology and to provide a sound quality enhancement circuit for audio signals, which enhances sound clarity, is easily formed in an IC and is suitable for driving, in particular, a full range speaker and an audio amplifier circuit using the circuit.

Further, the full range speaker, which will be referred to in the present specification and claims includes a speaker system constituted by a combination of substantial full range corn type speaker and a tweeter having a crossover frequency of about 5000 Hz or more. Still further, a speaker having a diameter of corn portion of about 13 cm or less is referred to as a small speaker.

A sound quality enhancement circuit for audio signals and an audio amplifier circuit using the circuit according to the present invention which achieve the above objects are characterized, in that the sound quality enhancement circuit for audio signals which produces audio output signals of which phase is corrected with respect to audio input signals for enhancing the sound quality generated from a speaker, comprises a cascade connected circuit having at least three phase shift circuits which are connected in cascade and wherein the phase characteristic of the cascade connected circuit is determined in such a manner that the phase of the audio input signals is gradually delayed depending on logarithmic increase of frequencies in a range of audible frequencies and a phase delay in a range of 450 degree~600 degree in total in the range of audible frequencies is caused.

In an audio apparatus including a car stereo and such as a TV apparatus, a DVD, a mini component stereo and a computer audio a comparatively small speaker is used. Therefore, the present invention draws attention to audio frequency components in 100 Hz~20 kHz. In this frequency range, the phase thereof is gradually delayed along a linear inclination depending on logarithmic increase of the frequencies from a low frequency region (less than 200 Hz) to an intermediate frequency region (200 Hz~4 kHz) and to high frequency region (more than 4 kHz) and a phase shift delay of about 450 degree or more in total is provided. For this purpose, in the present invention, as referred to above, by making use of at least three stage phase shift circuits the phase is gradually delayed depending on logarithmic increase of frequencies from the low frequency region to the intermediate frequency region and to the high frequency region and a phase delay in a range of about 450 degree~600 degree over the range of audible frequencies (20 Hz~20 kHz) is caused, and the high frequency components of the sound generated from the speaker are delayed and matched with the time axis of the low frequency components to thereby enhance the sound quality.

In particular, since the rise up characteristic of a small corn speaker having a diameter of about 10 cm is poor in comparison with that of an medium or large corn speaker, if a phase shift delay of 150 degree or more is provided in a range of 100 Hz~200 Hz, sound sharpness is improved.

The reason thereof is that in the small speaker having a diameter of about 10 cm the fundamental waves are concentrated in a low frequency region of 100 Hz~200 Hz and contrary the harmonic components are concentrated in a high frequency components of 8 kHz~15 kHz. When the phase is shifted linearly by 540 degree in the range of audible frequencies in response to the logarithmic increase of the frequencies from the low frequency region to the high frequency region of the audio signals, the phase shift characteristic in the range of 8 kHz~15 kHz can be substantially correlated to the phase shift characteristic of the fundamental waves in the range of 100 Hz~200 Hz with phase difference of 360 degree.

Figure 4:
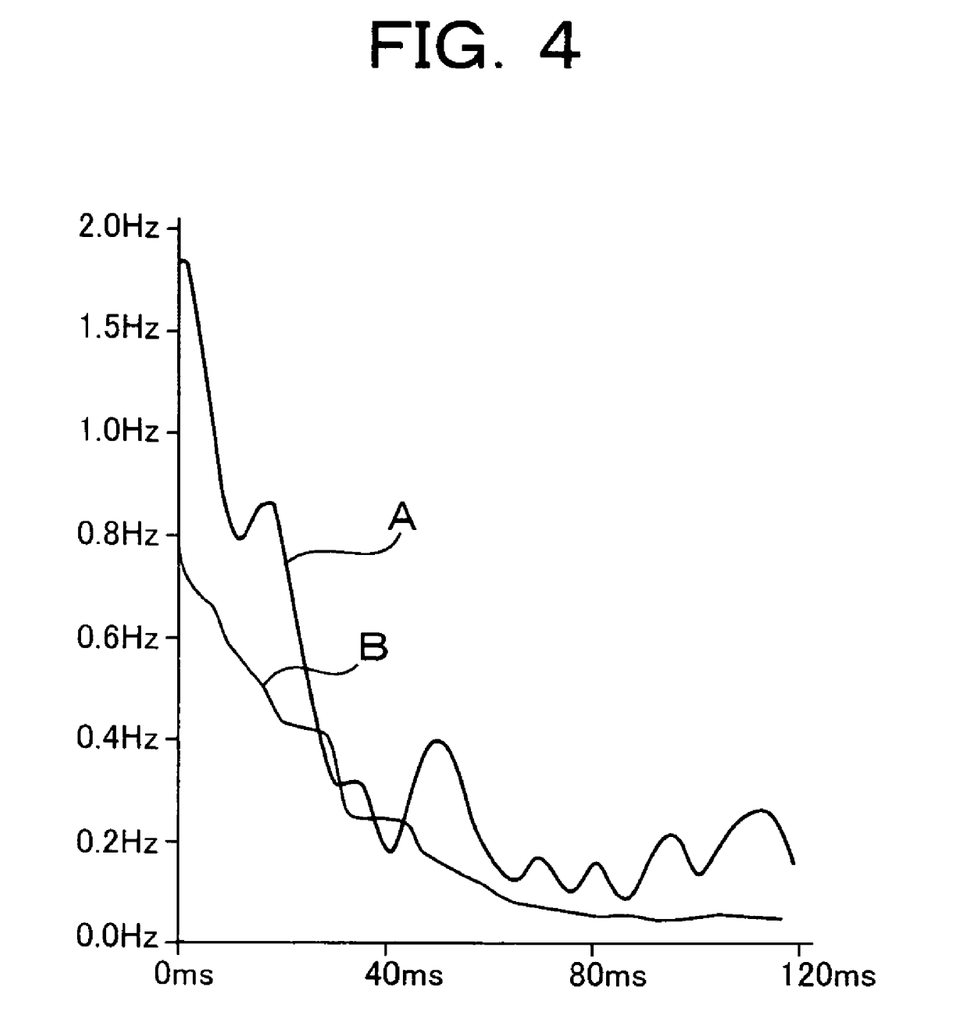
FIG. 4 is a view for explaining an exemplary rise up characteristic in a transient characteristic of a small speaker.

FIG. 4 is a view for explaining the rise up characteristic of a small speaker (having a diameter of about 10 cm) for explaining the feature of the present invention.

Generally in a speaker, a vibration wave shape (output wave form) of the corn at the time of sound rise up with respect to input signals is distorted and it takes time before a vibration wave shape (output wave form) of the corn at the time of steady state. FIG. 4 illustrates a degree of the distortion of the output waveform as a frequency offset with respect to the input signals. The ordinate represents an offset amount of frequency and the abscissa is time after starting signal input to the speaker. Further, in the present embodiment, the offset amount of frequency is measured through spectrum analysis.

Letter A represents a characteristic obtained by averaging the offset amount of frequency at the time of rise up of the sound for audio signals of 100 Hz~1 kHz of which signal range is dealt as low frequency region, and B represents a characteristic obtained by averaging the like offset amount for audio signals of 4 kHz~8 kHz of which signal range is dealt as high frequency region.

The volume is set at about intermediate. Because when the volume is reduced, the offset amount in the low frequency region does not reduce much.

From the above characteristics, it will be understood that when about 20 msec elapses after starting the signal input to the speaker, the offset amount in the low frequency region is greatly reduced and comes close to that in the high frequency region.

When enhancing the sound quality, it is necessary to eliminate differences in offset amounts at the time of rise up in both the low frequency region and the high frequency region. On the other hand, in order to reproduce an original sound it is an important factor that the phases of the fundamental wave and the high frequency wave match each other.

The harmonic components are primarily constituted by high frequencies more than 8 kHz. In the conventional art as shown in FIG. 5, there is a phase difference of 360 degree in the range of audible frequencies, however, between frequencies in the low frequency region and the frequencies in the high frequency region the substantial phase difference is only about 280 degree. Although preceding harmonic components are matched with respect to succeeding low frequency components with a delay of about 1 Hz, the phase difference between the high frequency components and the fundamental wave of 100 Hz reduces below 360 degree, thereby a sufficient phase matching can not be achieved and a sound quality enhancement can not realized for the small speaker.

Further, with respect to audio signal of 100 Hz, 1 Hz corresponds to 10 msec, at which the offset amount at the time of rise up in the low frequency region and the high frequency region is large as shown by characteristics A and B in FIG. 4. For this reason the sound quality is not enhanced much.

In order to superpose the high frequency region and the low frequency region with reference to 20 msec at which the offset amount at the time of rise up in the low frequency region and the high frequency region is small, in considering the characteristics as shown in FIG. 4 and while assuming that the fundamental wave of the small speaker is 100 Hz, if a phase shift of substantially 720 degree is provided between the frequencies in the low frequency region and the high frequency region, the offset amount at the time of rise up in the low frequency region and the high frequency region is reduced and the sound quality must be enhanced. However, a phase shift of more than 720 degree is provided, a preceding harmonic component which is delayed by 2 Hz with respect to the fundamental wave of 100 Hz has to be matched with respect to succeeding low frequency components. As a result, the phase offset between the high frequency wave and the fundamental wave is enlarged and the sound quality cannot be enhanced.

For this reason, for a small speaker, when a harmonic component is matched with 1 Hz~1.5 Hz delay with respect to the fundamental wave of 100 Hz, the offset amount at the time of rise up in the low frequency region and the high frequency region is reduced, as well as the phase offset between the high frequency wave and the fundamental wave is reduced and a sound quality enhancement as a whole is observed, which is the principle of the present invention.

Further, in the present invention, in addition to the above, in order to shift sound image toward an upper position for sound image positionality, the frequency gain total characteristic is determined in such a manner that a crest is provided in a range 500 Hz~1 kHz and a gain boost is provided at 1 kHz for rising up the gain near at 1 kHz. With this measure, a sound quality variation in the voice range of 500 Hz~1 kHz can be suppressed, and the deterioration thereof is prevented. Moreover, by avoiding the boost at 500 Hz~1 kHz noises can be reduced. Thereby, sound quality can be enhanced for a speaker in a cell phone which uses a small speaker having a diameter of about 1.5 cm~3 cm.

As a result, the present invention can enhance clarity of sound and in addition can be realized with a small number of phase shift circuits, which facilitates to produce an IC. Moreover, since a sound quality enhancement circuit suitable for driving a full range speaker and an audio amplifier using the circuit can be realized, a sound quality of an audio system, which is disposed in a narrow acoustic space, can be enhanced.

DETAILED DESCRIPTION OF THE EMBODIMENT

Figure 1:
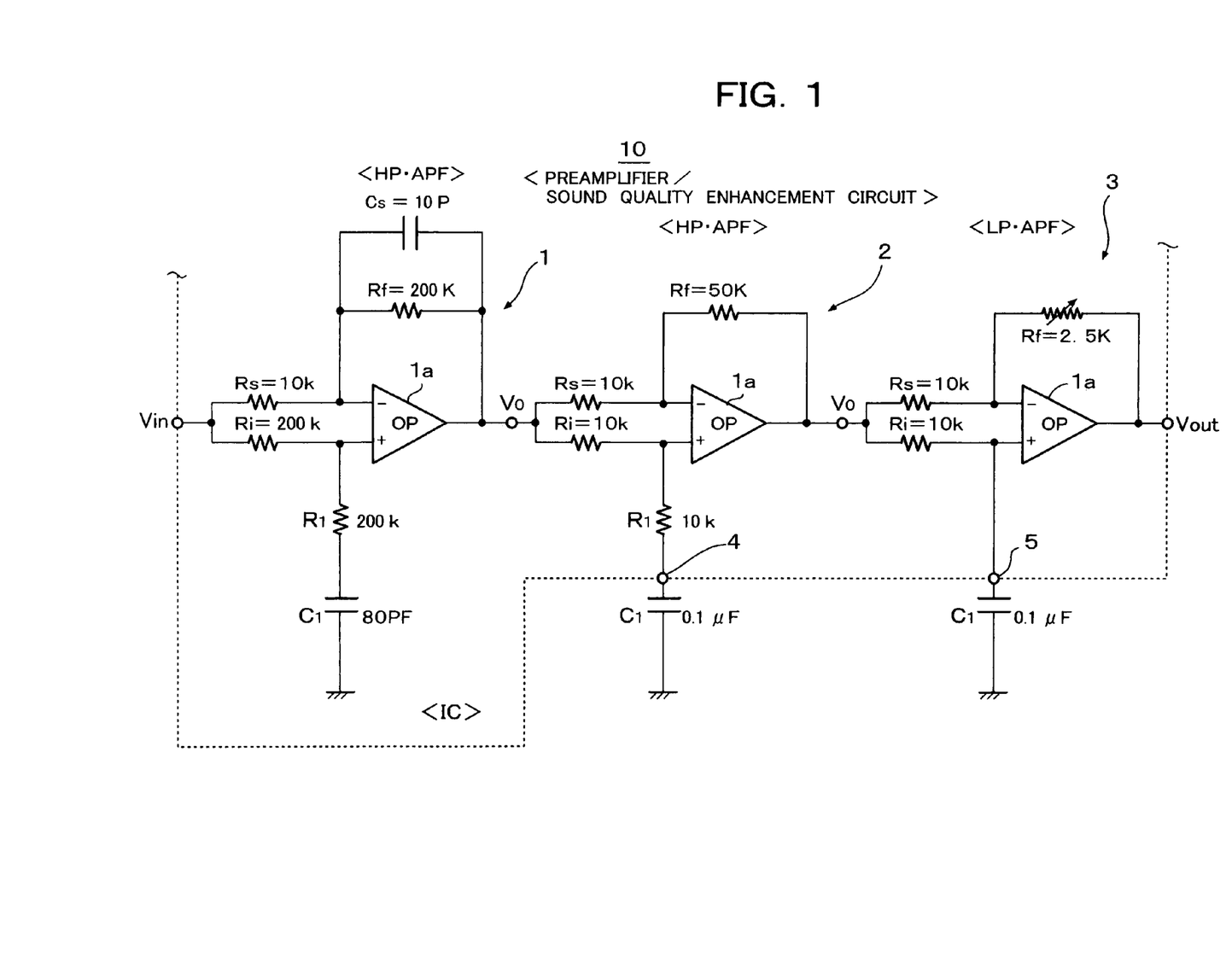
FIG. 1 is a preamplifier representing an embodiment to which a sound quality enhancement circuit for audio signals according to the present invention is applied.

In FIG. 1, numeral 10 is a phase and gain correction circuit for sound quality enhancement (sound quality enhancement circuit), which is formed in an IC circuit and is built-in in an preamplifier, and is constituted by a cascade connected circuit of high pass type all pass active filters (HP•APF) 1 and 2 and a low pass type all active filter (LP•APF) 3.

The HP•APF 1 and 2 and the LP•APF 3 are 180 degree phase shift circuits each constituted by an operation amplifier, and through cascade connecting these phase shift circuits in three stages gradually delays and shifts the phases of audio signals depending on logarithmic increase of the frequencies with respect to the audio signals and shifts by 540 degree in total in a range of audible frequency (20 Hz~20 kHz). Thereby, a phase delay of a high frequency region is provided with respect to a low frequency region.

Although, the total amount of the phase shift in the present invention is 540 degree, the present invention is not limited to the amount, but allows a phase delay in a range of about 450 degree~600 degree in the range of audible frequency (20 Hz~20 kHz). The reason thereof is that as seen from characteristics A and B in FIG. 4 the offset amount in frequencies varies and reduces at about 30 msec.

The HP•APF 1 and 2 and the LP•APF 3 are phase shift circuits of all pass active filter each of which gradually delays the phases of the audio signals depending on logarithmic increase of the frequency of the audio signals and shifts the same by 180 degree and further are circuits each constituted by providing a gain characteristic at the high frequency and low frequency region sides.

The HP•APF 1 is a crest type filter in which gain characteristic the gain increases from 200 Hz and a peak is provided at 20 kHz as shown in FIG. 2 (a), and is a phase shift circuit having 180 degree phase delay of which the phase characteristic delays linearly and gradually with respect to logarithmic frequency increase from 100 Hz toward 20 kHz.

The HP•APF 2 is a filter in which gain characteristic the gain increases from 10 Hz, reaches to a peak at 200 Hz and then flattens as shown in FIG. 2 (b), and is a phase shift circuit having 180 degree phase delay of which the phase characteristic delays linearly and gradually with respect to logarithmic frequency increase from 10 Hz toward 1 kHz.

The LP•APF 3 is a filter in which gain characteristic the gain decreases from 100 Hz, and then flattens from 1 kHz as shown in FIG. 2 (*c*), and is a phase shift circuit having 180 degree phase delay of which the phase characteristic delays linearly and gradually with respect to logarithmic frequency increase from 10 Hz toward 5 kHz.

Through cascade connecting these three phase shift circuits each having 180 degree phase delay with respect to frequency increase, the sound quality enhancement circuit 10 generates output signals being provided with phase delay of 540 degree in total in the range of audible frequency with respect to the input signals of the audio signals depending on the logarithmic frequency increase of the audio signals. Namely, the audio signals input at an input terminal Vin of the sound quality enhancement circuit 10 are output at an output terminal Vout output signals of which phases are shifted by 540 degree between from 20 Hz to 20 kHz.

As a result, the sound quality enhancement circuit 10 is provided with a phase and gain characteristic as shown in FIG. 2 (*d*). In the phase characteristic, the phase gradually delays along the inclination of phase characteristic straight line 6, which causes a shift of 540 degree over the range of audible frequency (20 Hz~20 kHz). Further, in the gain characteristic 7, a gain crest of about 4 dB is provided near 100 Hz, a boost is provided near from 1 kHz and near 10 kHz a gain of about 6~14 dB is set. For this reason the all pass filters having the above gain characteristics are used.

Figure 2A:
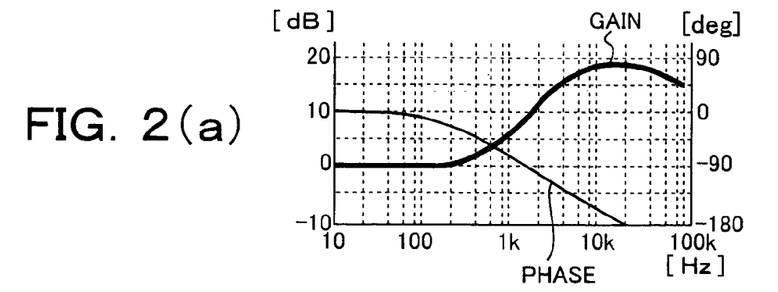
FIG. 2 is a view for explaining phase and gain characteristics with respect to frequency in respective phase shift circuits in the preamplifier in FIG. 1.
Figure 2B:
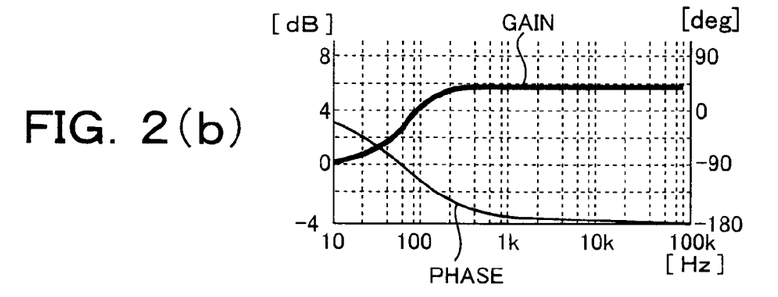
Figure 2C:
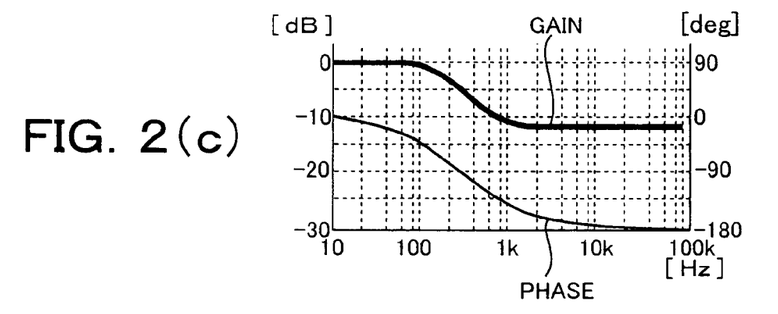
Figure 2D:
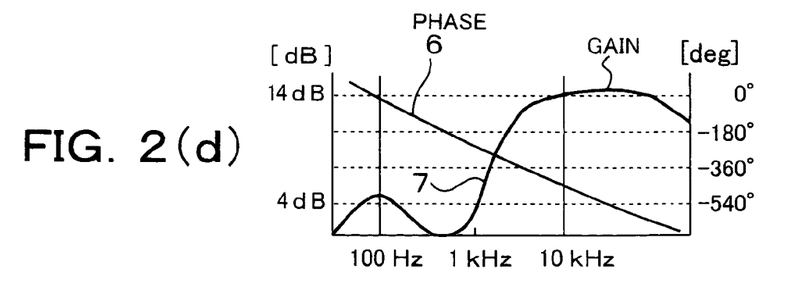

Thereby, the slack at the intermediate frequency region (200 Hz~4 kHz) is eliminated and the frequency components of 4 kHz and 8 kHz can be emphasized. Further, through delaying the phase of the high frequency region (20 kHz) by 540 degree with respect to the low frequency region (20 Hz), the harmonic components can be matched with respect to the fundamental wave of 100 Hz with substantially about 1 Hz~1.5 Hz as referred to the above as well as by reducing the rise up offset amount in the high frequency and low frequency regions, clarity of a small type speaker can be enhanced.

Now specific circuit constants will be explained. The HP•APF 1 is constituted by an operation amplifier 1*a* of differential operation which performs a non-inverted amplification in the low frequency region and an inverted amplification in the high frequency region, a reference resistor Rs connected to (−) input terminal of the operation amplifier, an input resistor Ri connected to (+) input terminal, a feedback resistor Rf inserted between an output terminal Vo and (−) input terminal and to determine the amplification rate and a filter circuit formed by a series connection of a resistor R1 and capacitor C1 connected between the (+) input terminal and the ground GND functioning as a filter for shifting the phase by 180 degree depending on the increase of the frequency.

The remaining terminals of the reference resistor Rs and input resistor Ri are connected to the input terminal Vin and the output terminal Vo is connected to an input terminal of the next stage HP•APF 2. The input resistor Ri=200 k Ω, the reference resistor Rs=10 k Ω, the feedback resistor Rf=200 k Ω, the resistor R1=200 k Ω and the capacitor C1=80 pF, which is a capacitor formed inside the IC. Further, a phase compensation use capacitor Cs=10 pF is connected in parallel with the feedback resistor Rf. Still further, the capacitor can be connected externally with respect to the IC.

Although the circuit constants are a little different, the HP•APF 2 is a phase shift circuit having the same circuit structure as that of the HP•APF 1. Namely, the HP•APF 2 is constituted by an operation amplifier 1*a* of differential operation which performs a non-inverted amplification in the low frequency region and an inverted amplification in the high frequency region, a reference resistor Rs connected to (−) input terminal of the operation amplifier, an input resistor Ri connected to (+) input terminal, a feedback resistor Rf inserted between an output terminal Vo and (−) input terminal and to determine the amplification rate and a filter circuit formed by a series connection of a resistor R1 and capacitor C1 connected between the (+) input terminal and the ground GND functioning as a filter for shifting the phase by 180 degree depending on the increase of the frequency. And the remaining terminals of the reference resistor Rs and input resistor Ri are connected to the output terminal Vo of the HP•APF 1 and the output terminal Vo of the HP•APF 2 is connected to an input terminal of the next stage LP•APF 3. The phase compensation use capacitor Cs connected in parallel with the feedback resistor Rf is eliminated, and the feedback resistor Rf=50 k Ω, the input resistor Ri=10 k Ω and the resistor R1=10 k Ω. The capacitor C1 is a capacitor externally connected to the IC through a terminal 4 of the IC and has a capacitance of 0.1 µF.

Although the circuit constants are a little different, the LP•APF 3 is a phase shift circuit having the same circuit structure as that of the HP•APF 2. Namely, the LP•APF•3 is constituted by an operation amplifier 1*a* of differential operation which performs a non-inverted amplification in the low frequency region and an inverted amplification in the high frequency region, a reference resistor Rs connected to (−) input terminal of the operation amplifier, an input resistor Ri connected to (+) input terminal, a feedback resistor Rf inserted between an output terminal Vo and (−) input terminal and to determine the amplification rate and a filter circuit formed by a capacitor C1 connected between the (+) input terminal and the ground GND functioning as a filter for shifting the phase by 180 degree depending on the increase of the frequency. And the remaining terminals of the reference resistor Rs and input resistor Ri are connected to the output terminal Vo of the LP•APF•3. The resistor R1 and the phase compensation use capacitor Cs connected in parallel with the feedback resistor Rf are eliminated, and the feedback resistor Rf=2.5 k Ω, the input resistor Ri=10 k Ω and the reference resistor Rs=10 k Ω. The capacitor C1 is a capacitor externally connected to the IC through a terminal 5 of the IC and has a capacitance of 0.1 µF.

However, the feedback resistor Rf is not a fixed resistor, but a variable resistor, thereby, the gain can be adjusted. The variable resistor is a programmable resistor of which resistor value can be externally selected such as by data setting. For example, in place of the feedback resistor, a feedback circuit in which one terminals of a plurality of resistors are connected in common and a selector selects one of the other terminals is provided as the programmable resistor and through the data setting a position of a resistor to be selected by the selector is determined.

Figure 3:
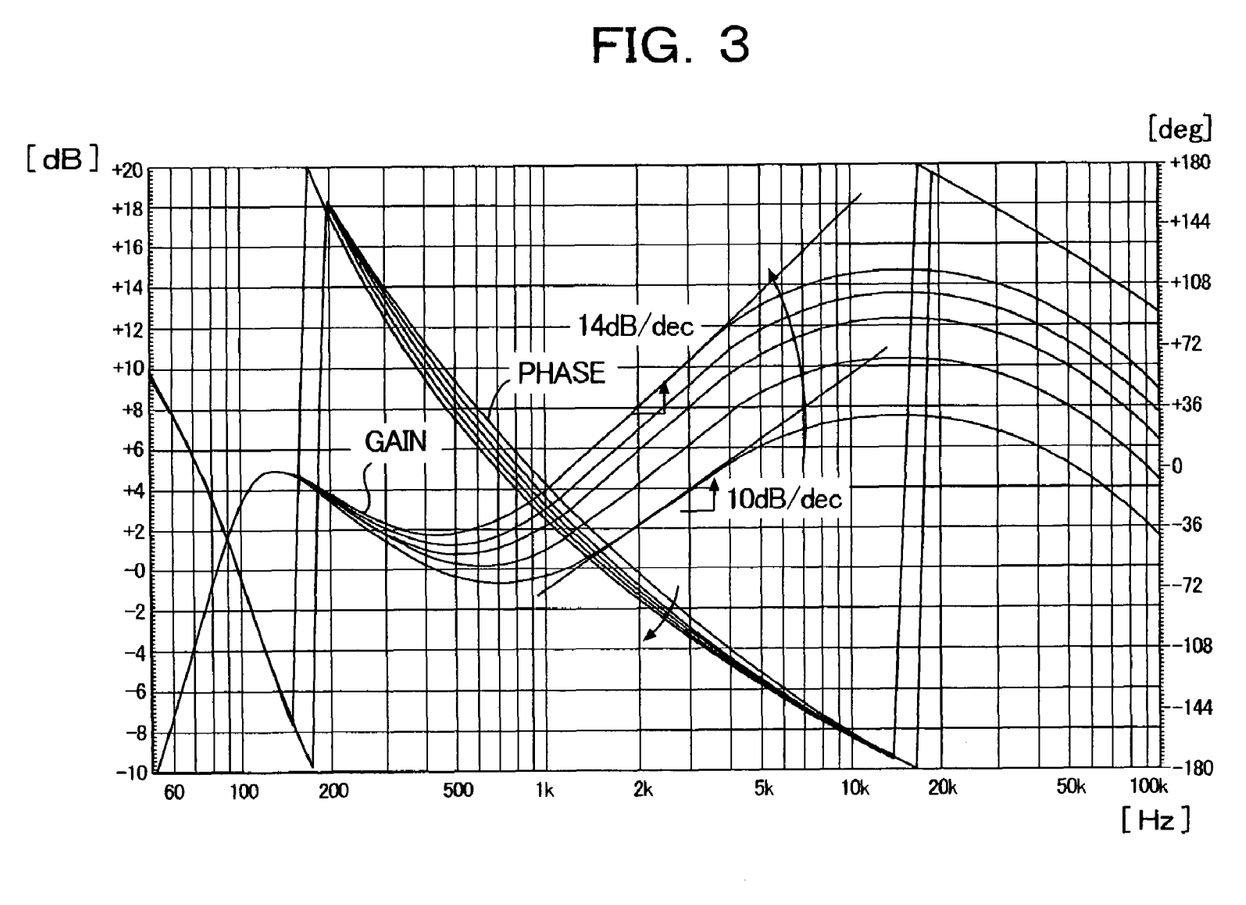
FIG. 3 is a view for explaining phase and gain characteristics with respect to frequency in a specific exemplary circuit.

FIG. 3 is a phase and gain characteristic with respect to frequency of the above circuit.

Further, in the phase characteristic of FIG. 3, although the phase is inverted from −180 degree to +180 degree near at 180 Hz and 20 kHz, which is because the continuously delaying phase is illustrated by offsetting the position from −180 degree to +180 degree.

As shown in the characteristic, as the phase characteristic, the sound quality enhancement circuit 10 provides a phase shift delay exceeding 360 degree with respect to audio frequency components of 100 Hz~8 kHz, in that more than 450 degree in total with respect to audio frequency components of 100 Hz~20 kHz. The phase characteristic 10 gradually delays the phases of the signals with substantially linear inclination depending on the logarithmic increase from a certain frequency in a low frequency region less than 200 Hz to a certain frequency in a high frequency region more than 8 kHz.

Then the phase is gradually delayed along the inclination of the phase characteristic straight line 6 as shown in FIG. 2 (*d*) depending on the logarithmic frequency increase from the low frequency region to the intermediate frequency region and to the high frequency region and provides about 540 degree over the range of the audible frequency (20 Hz~20 kHz).

Thereby, a phase shift of about 360 degree or more can be obtained for the high frequency region of more than 8 kHz with respect to a low frequency region of 100 Hz of a small speaker. As a result, for the small speaker, the harmonic components of 8 kHz~15 kHz can be matched for the fundamental components (100 Hz~200 Hz) with substantially about 1 Hz~1.5 Hz, thereby, the rise up offset amount in the low frequency and the harmonic components is reduced as well as the phase offset between the high frequency wave and the fundamental wave is reduced and the sound quality is enhanced as a whole.

Further, in a range from 800 Hz to 3 kHz, the amplitude is enhanced with more than 10 dB/dec and the gain characteristic in the intermediate frequency region is improved. The gain is adapted to be adjustable in maximum up to 14 dB/dec by adjusting the resistance value of the feedback resistor Rf (=2.5 k Ω) provided as the variable resistor in the LP•APF 3. Further, more than 20 kHz, the gain is gradually reduced. Thereby, noises in the high frequency region are reduced.

The gain adjustment is performed by varying the resistor value of 2.5 k Ω of the feedback resistor Rf in the LP•APF•3 and the phase thereof is at the same time varied as indicated by an arrow.

In particular, since a small type corn speaker having a diameter about 10 cm shows a poor rise up characteristic in comparison with that of a medium type or a large type speaker, the sound sharpness thereof can be improved by the above phase and gain correction. Further, for a speaker for a cell phone using a small type speaker having a diameter of 1.5 cm~3 cm the sound quality thereof can be enhanced with the above measure.

Moreover, since the gain boost which effects an upper position of sound image for sound image positionality is set near at 1 kHz to cause gain rise up from near 1 kHz, a sound quality variation in voice region of 500 Hz~1 kHz is suppressed, deterioration thereof is prevented and noises are reduced.

Now the connection order on FIG. 1 embodiment is not limited to the cascade connection of HP•APF 1 and 2 with LP•APF 3. Since the respective phase shift circuits are provided with a filter characteristic having gains at the high frequency region and low frequency region and a phase shift of 180 degree, these can be connected as the HP•APF 2 as first stage, the HP•APF 1 as second stage and the LP•APF 3 as final stage or alternatively, the LP•APF 3 as first stage, the HP•APF 1 as second stage and the HP•APF 2 as final stage. The connection order of these phase shift circuits is not limited.

Further, in the present embodiment, although the HP•APF 1 and 2 and LP•APF 3 are formed by integrating in to a single IC, these phase shift circuits can be of course formed in to respective separate ICs and these three ICs can be connected in cascade.

Still further, these phase shift circuits are not limited to the ICs, but can be of course constituted by separately connected capacitors and operation amplifiers.

In the embodiment hitherto explained, although the circuit is constituted in such a manner that with three all pass active filters of 180 degree phase shift circuits using the operation amplifiers, the phase of the audio signals is gradually delayed depending on the logarithmic increase of frequencies in the audio signals and resultantly the phase shift of 540 degree in the range of audible frequencies is effected, the number of the phase shift circuits in the present invention is not limited to 3 and further, the respective phase characteristics are not necessarily required to shift the high frequency region by 180 degree with respect to the low frequency region. When four phase shift circuits are used, it is accepted when the phase of one of these is shifted by 90 degree or more.

Still further, the respective phase shift circuits are not required to use the active filter. Still further, it is sufficient if the phase shift is performed by a certain angle in total within 450 degree~600 degree in the range of the audible frequencies.

The invention claimed is:

1. A sound quality enhancement circuit for an audio signal which produces an audio output signal of which phase is corrected with respect to an audio input signal for enhancing the sound quality generated from a speaker, comprising at least first, second and third phase shift circuits connected in cascade in the order and wherein each phase characteristic of the first, second and third circuits is respectively determined in such a manner that the phase of the own output signal is gradually delayed with respect to the own input signal depending on logarithmic increase of frequencies in a range of audible frequencies and is shifted by 90 degrees or more in the range of audible frequencies, a total phase characteristic of the first, second and third phase shift circuits causes a phase delay of the output signal from the third phase shift circuit with respect to the input circuit of the first phase shift circuit in a range of 450 degrees~600 degrees in total in the range of audible frequencies is caused, wherein two among the first, second and third phase shift circuits are active filter circuits each constituted by a high pass type all pass filter, the remaining one is an active filter constituted by a low pass type all pass filter, and a cascade connected circuit constituted by the first, second and third phase shift circuits has a phase characteristic which gradually delays the phases of the signal with substantially linear inclination depending on the logarithmic increase from a certain frequency in a low frequency region less than 200 Hz to a certain frequency in a high frequency region more than 8 kHz, and wherein a phase characteristic of the cascade connected circuit is determined in such a manner that the phase difference of the high frequency region more than 8 kHz with respect to the low frequency region of 100 Hz is 360 degrees or more, a phase shift between 100 Hz~200 Hz is 150 degrees or more and the total frequency and gain characteristic is provided with a crest in a range of 500 Hz~1 kHz and rises up near at 1 kHz.

2. The sound quality enhancement circuit according to claim 1, wherein the cascade connected circuit is a circuit formed in an IC, the gain inclination rising up near at 1 kHz in the total frequency and gain characteristic is more than 10 dB/dec, the gain inclination is adjustable and the audio signal is used for driving a full range corn type speaker having a diameter less than 13 cm.

3. The sound quality enhancement circuit according to claim 2, wherein the low pass type all pass filter is provided with a variable resistor for gain adjustment and the variable resistor is a programmable resistor.

4. The sound quality enhancement circuit according to claim 3, wherein the active filter is constituted by an operational amplifier of differential operation, the IC builds in a preamplifier and the cascade connected circuit is formed as a part of the preamplifier.

5. An audio amplifier circuit including a sound quality enhancement circuit for an audio signal which produces an audio output signal of which phase is corrected with respect to an audio input signal for enhancing the sound quality generated from a speaker, wherein the sound quality enhancement circuit comprises at least first, second and third phase shift circuits connected in cascade in the order and wherein each phase characteristic of the first, second and third circuits is respectively determined in such a manner that the phase of the own output signal is gradually delayed with respect to the own input signal depending on logarithmic increase of frequencies in a range of audible frequencies and is shifted by 90 degrees or more in the range of audible frequencies, a total phase characteristic of the first, second and third phase shift circuits causes a phase delay of the output signal from the third phase shift circuit with respect to the input circuit of the first phase shift circuit in a range of 450 degrees~600 degrees in total in the range of audible frequencies is caused, and wherein two among the first, second and third phase shift circuits are active filter circuits each constituted by a high pass type all pass filter, the remaining one is an active filter constituted by a low pass type all pass filter, and a cascade connected circuit constituted by the first, second and third phase shift circuits has a phase characteristic which gradually delays the phases of the signal with substantially linear inclination depending on the logarithmic increase from a certain frequency in a low frequency region less than 200 Hz to a certain frequency in a high frequency region more than 8 kHz wherein a phase characteristic of the cascade connected circuit is determined in such a manner that the phase difference of the high frequency region more than 8 kHz with respect to the low frequency region of 100 Hz is 360 degrees or more, a phase shift between 100 Hz~200 Hz is 150 degrees or more and the total frequency and gain characteristic is provided with a crest in a range of 500 Hz~1 kHz and rises up near at 1 kHz.

6. The audio amplifier circuit according to claim 5, wherein the cascade connected circuit is a circuit formed in an IC, the gain inclination rising up near at 1 kHz in the total frequency and gain characteristic is more than 10 dB/dec, the gain inclination is adjustable and the audio signal is used for driving a full range corn type speaker having a diameter less than 13 cm.

7. The audio amplifier circuit according to claim 6, wherein the low pass type all pass filter is provided with a variable resistor for gain adjustment and the variable resistor is a programmable resistor.

8. The audio amplifier circuit according to claim 7, wherein the active filter is constituted by an operational amplifier of differential operation, the IC builds in a preamplifier and the cascade connected circuit is formed as a part of the preamplifier.

* * * * *